US012418305B2

United States Patent
Guo et al.

(10) Patent No.: US 12,418,305 B2
(45) Date of Patent: Sep. 16, 2025

(54) THREE-STATE QUANTITATIVE SUCCESSIVE APPROXIMATION METHOD AND SUCCESSIVE APPROXIMATION ANALOG-TO-DIGITAL CONVERTER CIRCUIT

(71) Applicant: NewRadio Technologies Co., Ltd., Shenzhen (CN)

(72) Inventors: Xiaofeng Guo, Shenzhen (CN); Zhenqi Chen, Shenzhen (CN); Run Chen, Shenzhen (CN); Yonggang Chen, Shenzhen (CN)

(73) Assignee: NEWRADIO TECHNOLOGIES CO., LTD., Shenzhen (CN)

( * ) Notice: Subject to any disclaimer, the term of this patent is extended or adjusted under 35 U.S.C. 154(b) by 174 days.

(21) Appl. No.: 18/551,015

(22) PCT Filed: Feb. 15, 2022

(86) PCT No.: PCT/CN2022/076355
§ 371 (c)(1),
(2) Date: Sep. 18, 2023

(87) PCT Pub. No.: WO2022/213725
PCT Pub. Date: Oct. 13, 2022

(65) Prior Publication Data
US 2024/0171193 A1 May 23, 2024

(30) Foreign Application Priority Data
Apr. 9, 2021 (CN) .......................... 202110382997.1

(51) Int. Cl.
*H03M 1/34* (2006.01)
*H03M 1/46* (2006.01)

(52) U.S. Cl.
CPC .................................. *H03M 1/462* (2013.01)

(58) Field of Classification Search
CPC .... H03M 1/468; H03M 1/462; H03M 1/0854; H03M 1/38; H03M 1/466; H03M 1/804;
(Continued)

(56) References Cited

U.S. PATENT DOCUMENTS

| 4,940,983 A | * | 7/1990 | Phillips | H03M 1/80 341/171 |
| 5,736,953 A | | 4/1998 | Yamaguchi | |

(Continued)

FOREIGN PATENT DOCUMENTS

| CN | 105306059 A | 2/2016 |
| CN | 110277996 A | 9/2019 |
| CN | 110768670 A | 2/2020 |
| CN | 113437976 A | 9/2021 |
| WO | 87/03694 A1 | 6/1987 |

OTHER PUBLICATIONS

International Search Report corresponding to PCT Application No. PCT/CN2022/076355, mailed Apr. 28, 2022 (Chinese and English language document) (6 pages).
OA for CN application 202110382997.1.
English translation of OA for CN application 202110382997.1.

*Primary Examiner* — Linh V Nguyen
(74) *Attorney, Agent, or Firm* — Maginot, Moore & Beck, LLP

(57) ABSTRACT

The present disclosure provides a successive approximation method of three-state quantization and a successive approximation analog-to-digital converter circuit. The method includes for a first successive approximation of the arbitrary analog input signal between 0 and 1, comparing it with a quantization line 1/2; performing a second successive approximation according to a state of the first successive approximation; and by analogy up to a $N^{th}$ successive approximation, in case that a certain successive approximation is the state three during the comparison process, ending the approximation, indicating that the interval where the signal is located has been found.

2 Claims, 3 Drawing Sheets

(58) Field of Classification Search
CPC .... H03M 1/1245; H03M 1/08; H03M 1/1215; H03M 3/426; H03M 3/458; H03M 1/0607; H03M 1/0665; H03M 1/1033; H03M 1/1047; H03M 1/1052; H03M 1/129; H03M 1/403; H03M 1/46; H03M 7/165; H03M 1/002; H03M 1/06; H03M 1/0617; H03M 1/0626; H03M 1/0682; H03M 1/0863; H03M 1/1004; H03M 1/1014; H03M 1/1038; H03M 1/1057; H03M 1/1061; H03M 1/109; H03M 1/1205; H03M 1/124; H03M 1/14; H03M 1/18; H03M 1/182; H03M 1/201; H03M 1/34; H03M 1/36; H03M 1/687; H03M 1/742; H03M 1/802; H03M 3/352; H03M 3/37; H03M 3/382; H03M 3/452; H03M 3/454
USPC .......................... 341/155, 161, 162, 163, 172
See application file for complete search history.

(56) References Cited

U.S. PATENT DOCUMENTS

| | | | | |
|---|---|---|---|---|
| 8,404,271 | B2* | 3/2013 | Byrne | A61P 27/02 |
| | | | | 424/429 |
| 9,154,151 | B1* | 10/2015 | Leong | H03M 1/182 |
| 9,461,665 | B1* | 10/2016 | Kim | H03M 1/462 |
| 2011/0102219 | A1* | 5/2011 | Jeong | H03M 1/46 |
| | | | | 341/122 |
| 2015/0263756 | A1* | 9/2015 | Chiu | H03M 1/08 |
| | | | | 341/172 |
| 2018/0309413 | A1* | 10/2018 | D'Souza | H03F 3/45937 |
| 2019/0198043 | A1* | 6/2019 | Crespi | G10L 15/22 |
| 2020/0119744 | A1* | 4/2020 | Lin | H03M 1/0854 |
| 2021/0119673 | A1* | 4/2021 | Chen | H04W 72/12 |
| 2021/0313997 | A1* | 10/2021 | Alpman | H03M 1/0665 |
| 2022/0045690 | A1* | 2/2022 | Alpman | H03G 3/3005 |

* cited by examiner

THREE-STATE QUANTITATIVE SUCCESSIVE APPROXIMATION METHOD AND SUCCESSIVE APPROXIMATION ANALOG-TO-DIGITAL CONVERTER CIRCUIT

CROSS-REFERENCE TO RELATED APPLICATION

This application is a U.S. national stage of PCT/CN/2022/076355, which was filed on Feb. 15, 2022, and which claims priority to and benefits from Chinese Patent Application No. 202110382997.1, filed with the China National Intellectual Property Administration on Apr. 9, 2021, the contents of which are incorporated herein by reference in their entireties for all purposes.

FIELD

The present disclosure relates to a technical field of analog-to-digital converter (ADC) circuits in an integrated circuit design, and more particularly to implementation methods and circuits of a successive approximation register (SAR) ADC and a pipelined successive approximation register (Pipeline-SAR) ADC.

BACKGROUND

A successive approximation register analog-to-digital converter (SAR ADC) is a mainstream basic architecture under an advanced process in the current ADC field. At the beginning of the SAR ADC structure, due to its characteristics of a low power consumption, a high linearity and a low speed, the SAR ADC is generally used for ADCs in some scenarios with a low-speed (below 1 MSPS), a high-precision and a low-power consumption. Then ADCs with medium-speed (1 MSPS to 100 MSPS) and high-precision are gradually developed with an optimization of a design. Due to an advantage that the performance of the SAR ADC is inversely proportional to a process size, its application is becoming more and more extensive with a progress of the process. Under the advanced process, the SAR ADC is used in ADCs in almost all scenarios. However, an original SAR ADC itself cannot meet needs of some scenarios due to its speed and accuracy limit. Its structure has evolved into various SAR-based hybrid structures through design iterations, such as pipelined-SAR ADCs suitable for high-speed (300 MSPS to 1 GSPS), high-precision and low-power conversion scenarios, time-interleaved pipeline-SAR ADCs and time-interleaved SAR ADC suitable for ultra-high-speed (1 GSPS to 10 GSPS) and high-precision, and noise shaping SAR ADCs with medium-low-speed and ultra-high-precision (greater than 16 bits effective number of bits).

The successive approximation register ADC is an ADC that maps a continuous analog input to a discrete digital output by dichotomous successive comparisons, as shown in FIG. 1, which is a schematic diagram of a mathematical form of this method. Its mathematical description is as follows. A two-bit successive approximation register ADC is taken as an example. For an arbitrary analog signal whose input is between 0 and 1, the analog signal is compared with a quantization line 1/2 on a first approximation. In case that the analog signal is greater than 1/2, then the analog signal is compared with a quantization line 3/4 on a second approximation, otherwise, the analog signal is compared with a quantization line 1/4. A corresponding digital code is output according to the first and second comparison results.

In case that the analog signal is greater than 1/2 and greater than 3/4, the output digital code is 11, in case that the analog signal is greater than 1/2 and less than 3/4, the output digital code is 10, and in case that the analog signal is less than 1/2 and greater than 1/4, the output digital code is 00. It is a two-state quantization conversion process, and each quantization has only two situations, that is, above the quantization line or below the quantization line. A conventional successive approximation register ADC circuit implementing a two-state successive approximation process includes an edge-type clock generator, a comparator with a latch, an edge-triggered digital logic circuit, and a DAC capacitor array.

The successive approximation register ADC implemented according to this dichotomous successive approximation process has two problems. The first problem arises with the analog input signal, which is an arbitrary continuous signal between 0 and 1. When the signal closely aligns with reference quantization lines of 1/2, 3/4, and 1/4, it significantly complicates comparisons and extends the ADC's comparison time. The upper limit of this comparison time is determined by the comparator's noise saturation. The ADC design needs to consider all input signal situations, so these extremely slow conditions will extend the overall conversion time. A second issue is that bisecting a complete area successively with a two-state numerical scale line isn't the most efficient quantization process. In other words, N successive approximations can only achieve a quantization accuracy of $1/2^N$.

SUMMARY

The aim of this disclosure is to overcome the shortcomings in the related art by providing a three-state quantization successive approximation method and a corresponding analog-to-digital converter circuit.

This disclosure proposes a successive approximation method of three-state quantization. The method is designed for the successive approximation of an arbitrary analog input signal between 0 to 1 (where 0 to 1 is defined as the full scale) and N-bit, including the following steps:

1) for a first successive approximation of the arbitrary analog input signal between 0 and 1, comparing it with a quantization line 1/2:

in case that the signal is greater than an interval of $1/2+1/2^{N+1}$, recording the first successive approximation to state one;

in case that the signal is smaller than an interval of $1/2-1/2^{N+1}$, recording the first successive approximation to state two;

in case that the signal is located in an interval of $1/2\pm 1/2^{N+1}$, recording the first successive approximation to state three, indicating that an interval where the signal is located has been found at the same time, which is in the interval of $1/2\pm 1/2^{N+1}$, and ending an approximation process;

in case that the successive approximation to the state one or the state two is generated, then turning to step 2);

2) performing a second successive approximation according to a state of the first successive approximation;

in case that a result of the first successive approximation is the state one, continuing to compare the signal with an interval of $3/4\pm 1/2^{N+1}$, with a comparison result producing one of three approximate states;

in case that the result of the first successive approximation is the state two, continuing to compare the signal with an interval of $1/4\pm1/2^{N+1}$, with a comparison result producing one of the three approximate states; and in case that the successive approximation is generated to the state three, indicating that a signal interval has been found, which is within an interval of a quantization reference line, and ending the approximation process; in case that the successive approximation is generated to the state one or the state two, then turning to step 3);

3) by analogy up to a $N^{th}$ successive approximation, in case that a certain successive approximation is the state three during the comparison process, ending the approximation, indicating that the interval where the signal is located has been found.

A successive approximation analog-to-digital converter (ADC) circuit that implements the above method is provided in the present disclosure. The circuit is composed of a pulse-type clock generator, a comparator without a latch, a first inverter and a second inverter as drivers, logic circuits of N groups of differential pulse positive feedback latch structure and corresponding N groups of digital-to-analog converter (DAC) capacitors. A logic circuit of each group of differential pulse positive feedback latch structure is composed of a first AND gate, a first N-metal-oxide-semiconductor (NMOS) transistor, a first P-metal-oxide-semiconductor (PMOS) transistor, a third inverter, a fourth inverter and a seventh inverter, as well as a second AND gate, a second NMOS transistor, a second PMOS transistor, a fifth inverter, a sixth inverter and an eighth inverter with same structures. A connection relationship is as follows: differential input terminals of a first comparator are connected to differential signals Vp and Vn respectively, a clock terminal of the first comparator is connected to a comparator clock CLK_CMP of a timing pulse generated by the pulse-type clock generator, two differential comparison output terminals Tn and Tp of the first comparator are connected to an input terminal of the first inverter and an input terminal of the second inverter respectively, an output terminal of the first inverter is connected to an input of the first AND gate, an output terminal of the second inverter is connected to an input of the second AND gate, and another inputs of the first AND gate and the second AND gate are connected to a logic circuit clock CLK_LOGICx, where x is any number from 1 to N.

An output terminal of the first AND gate is connected to a gate terminal of the first NMOS transistor, an output terminal of the second AND gate is connected to a gate terminal of the second NMOS transistor, a source terminal of the first NMOS transistor and a source terminal of the second NMOS transistor are grounded, a source terminal of the first PMOS transistor and a source terminal of the second PMOS transistor are connected to a power supply, and reset signals RST are connected to a gate terminal of the first PMOS transistor and a gate terminal of the second PMOS transistor respectively, and a drain terminal of the first PMOS transistor and a drain terminal of the second PMOS transistor are connected to a drain terminal of the first NMOS transistor and a drain terminal of the second NMOS transistor respectively and output to input terminals of the third inverter and the fifth inverter respectively.

Output terminals of the third inverter and the fifth inverter are connected to input terminals of the fourth and seventh inverters and input terminals of the sixth and eighth inverters respectively, while an output terminal of the fourth inverter is connected to an input terminal of the third inverter, and an output terminal of the sixth inverter is connected to an input terminal of the fifth inverter.

Power supplies and ground terminals of the seventh inverter and the eighth inverter are connected to a positive reference voltage Vrefp and a negative reference voltage Vrefn respectively, and output terminals of the seventh inverter and the eighth inverter output a digital code DPx and a digital code DNx to connect lower plates of a first capacitor and a second capacitor respectively, upper plates of the first capacitor and the second capacitor are connected to Vp and Vn respectively, and the first capacitor and the second capacitor constitute a differential unit in a DAC capacitor array.

DETAILED DESCRIPTION

A successive approximation method of three-state quantization and a successive approximation analog-to-digital converter circuit provided in the present disclosure are described in detail below in conjunction with accompanying drawings and embodiments as follows.

The present disclosure includes a three-state successive approximation method, and an implementation circuit of the three-state successive approximation ADC.

Compared with a traditional two-state successive approximation process, the three-state successive approximation method of the present disclosure has three states in comparison with a quantization reference line in each successive approximation process. A small interval is set above and below the quantization reference line, above this interval is determined as a first state, below this interval is determined as a second state, and within this interval is determined as a third state. This method may relax a restriction on comparison, and further, a small interval range above and below the quantitative reference line is set around ±1/4 LSB which may improve quantization efficiency.

Based on this method, the present disclosure provides a three-state successive approximation register ADC circuit. Compared with a traditional circuit, this circuit does not add additional cost, while a quantization accuracy may be improved by nearly one bit, and a speed is faster with a smaller area. In some embodiments, single conversion time is only 16 intrinsic delay time of a standard inverter (28 nm CMOS is about 10 pS, and 7 nm to 14 nm FinFET is about 2 to 3 pS). Delay time of a single bit logic part is only 4 delay time of the standard inverter, and hardware expenditure of a single bit logic circuit is only 12 transistors.

Figure 1:
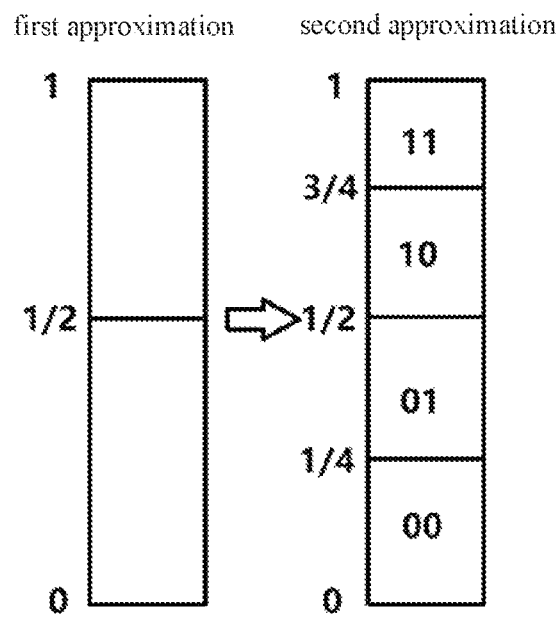
FIG. 1 is a schematic diagram of a mathematical form of a conventional successive approximation method.
Figure 2:
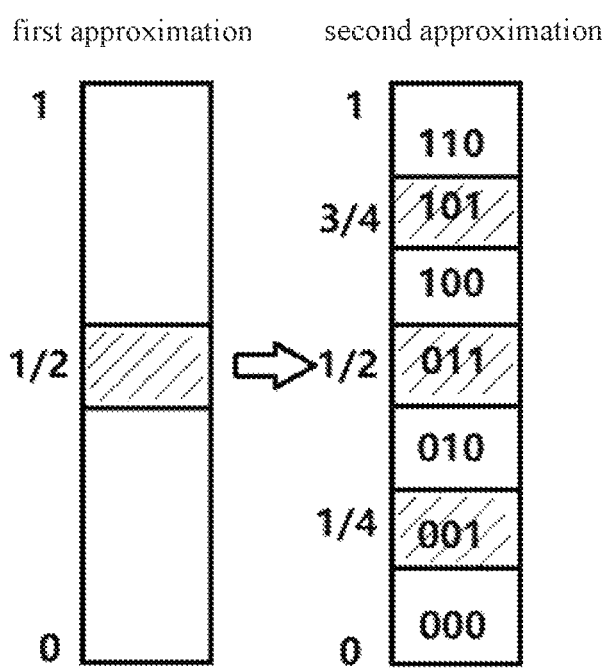
FIG. 2 is a schematic diagram of a mathematical form of a three-state successive approximation method of the present disclosure.

A successive approximation method of three-state quantization is provided in the present disclosure, as shown in FIG. 2. The method is configured to a successive approximation of an arbitrary analog input signal between 0 to 1 (here, 0 to 1 is specified as a full scale) and a N bit, and includes following steps.

In step 1, for a first successive approximation of the arbitrary analog input signal between 0 and 1, the analog input signal is compared with a quantization line 1/2. In case that the signal is greater than an interval of $1/2+1/2^{N+1}$, it is recorded that the first successive approximation is state one. In case that the signal is smaller than an interval of $1/2-1/2^{N+1}$, it is recorded that the first successive approximation is state two. In case that the signal is located in an interval of $1/2\pm1/2^{N+1}$, it is recorded that the first successive approximation is state three, which indicates that an interval where the signal is located has been found at the same time, the interval is in the interval of $1/2\pm1/2^{N+1}$, and an approximation process is ended. In case that the successive approximation to the state one or the state two is generated, then it turns to step 2.

In step 2, a second successive approximation is performed according to a state of the first successive approximation. In case that a result of the first successive approximation is the state one, the signal is continued to compare with an interval of $3/4\pm1/2^{N+1}$ to generate a comparison result that is same as one of three approximate states as in step 1. In case that the result of the first successive approximation is the state two, the signal is continued to compare with an interval of $1/4\pm1/2^{N+1}$ to generate a comparison result that is same as one of the three approximate states as in step 1. In case that the state three occurs in the above approximation, it indicates that a signal interval has been found, which is within an interval of a quantization reference line, and ending the approximation process. In case that the successive approximation is generated to the state one or the state two, then it turns to step 3.

In step 3, by analogy up to a $N^{th}$ successive approximation, in case that a certain successive approximation is the state three during the comparison process, ending the approximation, it indicates that the interval where the signal is located has been found.

N times of successive approximation comparisons of the above method may produce $2^{N+1}-1$ different results in total. For the signals with inputs from 0 to 1, corresponding digital maps are 000 . . . 000, 000 . . . 001, . . . , 011 . . . 111 (N+1 bits binary outputs), and its quantized signal-to-noise ratio is $20*\log(2^{N+1}-1)$, which is close to a quantized signal-to-noise ratio ($20*\log(2^{N+1}-1)$) of a N+1 bit two-state successive approximation.

For example, N is equal to 2 in the above method, and specific descriptions are as follows.

In step 1, for a successive approximation of an arbitrary analog input signal between 0 to 1 (here, 0 to 1 is specified as a full scale) and N bits, when a first successive approximation, the analog input signal is compared with a quantization reference line 1/2. In case that the signal is greater than $1/2+1/2^{N+1}$, the first successive approximation is recorded to state one. In case that the signal is smaller than $1/2-1/2^{N+1}$, the first successive approximation is recorded to state two. In case that the signal is located in an interval of $1/2+1/2^{N+1}$, the first successive approximation is recorded to state three, which indicates that an interval where the signal is located has been found at the same time, the interval is in the interval of $1/2+1/2^{N+1}$, and an approximation process ends. In case that the successive approximation to the state one or the state two is generated, then it turns to step 1.

In step 2, a second successive approximation is performed according to a state of the first successive approximation. For a result of the first successive approximation is the state one, the signal is continued to compare with an interval of $3/4\pm1/2^{N+1}$, one of three approximate states is produced according to a comparison result as in step 1. For the result of the first successive approximation is the state two, the signal is continued to compare with an interval of $1/4\pm1/2^{N+1}$, one of the three approximate states is produced according to a comparison result as in step 1; so far, the approximation ends.

After the approximation ends, a quantization from the analog input to the digital output is done. For the input signals from 0 to 1, the digital maps of [0, 3/16), (3/16, 5/16), (5/16, 7/16), (7/16, 9/16), (9/16, 11/16), (11/16, 13/16), (13/16, 1] are 000, 001, 010, 011, 100, 101, and 110 respectively. It could be seen that although the map intervals of [0, 3/16), (13/16, 1] have 1/16 unbalanced compared to other intermediate map intervals, their overall quantization accuracy (a quantization accuracy is close to 1/16) is still higher than the $2^{th}$ approximation (the quantization accuracy is 1/8) under the traditional two-state successive approximation method, and as a range of the interval is not so strict (the interval of the quantization reference line may be around ±1/16), which saves the comparison time when approximating.

Figure 3:
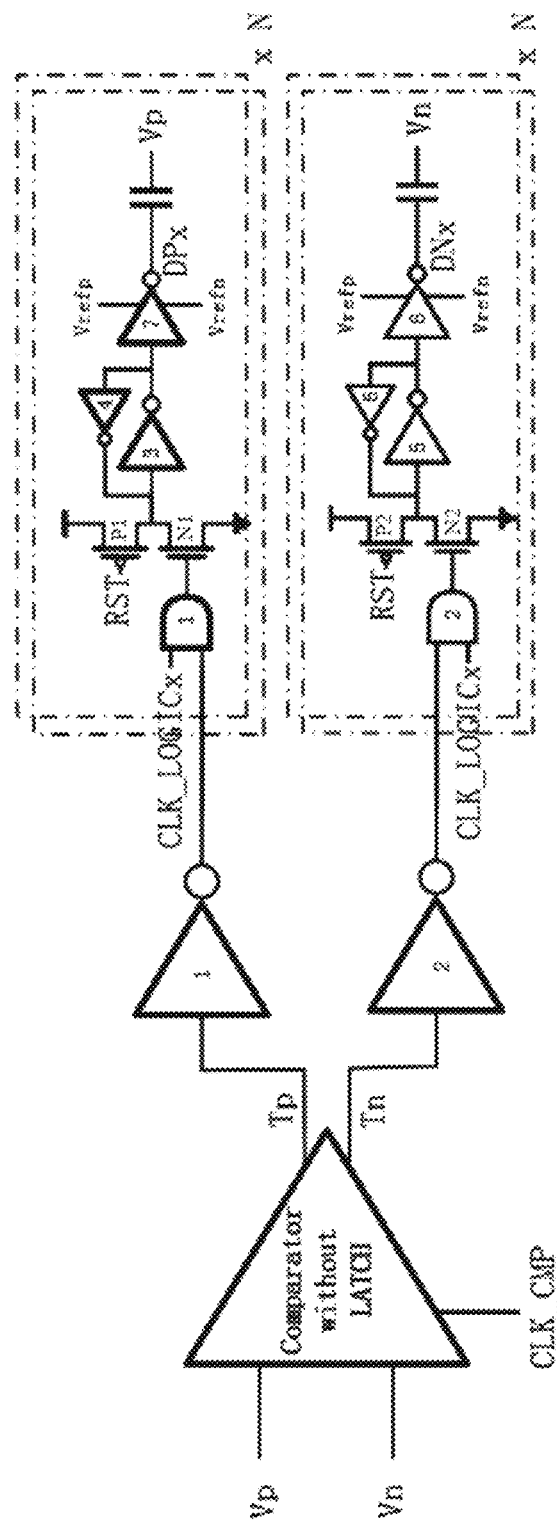
FIG. 3 is an ADC circuit diagram of the present disclosure.

A successive approximation ADC circuit that implements the above method is provided in the present disclosure, as shown in FIG. 3. The circuit is composed of a pulse-type clock generator (not shown in the figure), a comparator without a latch, a first inverter and a second inverter as drivers, logic circuits of N groups of differential pulse positive feedback latch structure and corresponding N groups of DAC capacitors, and a logic circuit of each group of differential pulse positive feedback latch structure is composed of a first AND gate, a NMOS transistor N1, a PMOS transistor P1, a third inverter, a fourth inverter and a seventh inverter, as well as a second AND gate, a NMOS transistor N2, a PMOS transistor P2, a fifth inverter, a sixth inverter and an eighth inverter with same structures. A connection relationship is as follows. Differential input terminals of a first comparator are connected to differential signals Vp and Vn respectively. A clock terminal of the first comparator is connected to a comparator clock CLK_CMP of a timing pulse generated by the pulse-type clock generator. Two differential comparison output terminals Tn and Tp of the first comparator are connected to an input terminal of the first inverter (a driver) and an input terminal of the second inverter (a driver) respectively. An output terminal of the first inverter is connected to an input of the first AND gate, and an output terminal of the second inverter is connected to an input of the second AND gate. Other inputs of the first AND gate and the second AND gate are connected to a logic circuit clock CLK_LOGICx (CLK_LOGICx indicates CLK_LOGIC1, CLK_LOGIC2, . . . , depending specifically on a digital logic circuit of a $x^{th}$ SAR). An output terminal of the first AND gate is connected to a gate terminal of the first NMOS transistor N1, and an output terminal of the second AND gate is connected to a gate terminal of the second NMOS transistor N2. A source terminal of the first NMOS transistor and a source terminal of the second NMOS transistor are grounded, and a source terminal of the first PMOS transistor P1 and a source terminal of the second PMOS transistor P2 are connected to a power supply. Reset signals RST are connected to a gate terminal of the first PMOS transistor P1 and a gate terminal of the second PMOS transistor P2 respectively, and a drain terminal of the first PMOS transistor P1 and a drain terminal of the second PMOS transistor P2 are connected to a drain terminal of the first NMOS transistor and a drain terminal of the second NMOS transistor respectively, and are output to an input terminal of the third inverter and an input terminal of the fifth inverter respectively. Output terminals of the third inverter and the fifth inverter are connected to input terminals of the fourth and seventh inverters and input terminals of the sixth and eighth inverters respectively, while an output terminal of the fourth inverter is connected to an input terminal of the third inverter, and an output terminal of the sixth inverter is connected to an input terminal of the fifth inverter. Power supplies and ground terminals of the seventh inverter and the eighth inverter are connected to a positive reference voltage Vrefp and a negative reference voltage Vrefn respectively, and output terminals of the seventh inverter and the eighth inverter output a digital code DPx (a conversion output of a first bit is DP1, a conversion output of a $x^{th}$ bit is DPx, . . . , until a conversion output of a $N^{th}$ bit is DPN) and a digital code DNx (a conversion output of the first bit is DN1, a conversion output of the $x^{th}$ bit is DNx, . . . , until a conversion output of the $N^{th}$ bit is DNN) to connect lower plates of a first capacitor and a second capacitor respectively. Upper plates of the first capacitor and the second capacitor are connected to Vp and Vn respectively, and the first capacitor and the second capacitor constitute a differential unit in a DAC capacitor array.

For the N bit three-state SAR ADC of the present disclosure, the circuit inside dotted line box needs to be replicated N to implement the N bit conversion. The digital outputs of the final N-bit conversion are DOUT=1/2 (DP1DP2 . . . DPx . . . DPN+DN1DN2 . . . DNx . . . DNN). For example, based on N is equal to 2, a first conversion result DP1=1 and DN1=0, a second conversion result DP2=0 and DN2=1, then the digital output is DOUT=1/2 (10+01).

Figure 4:
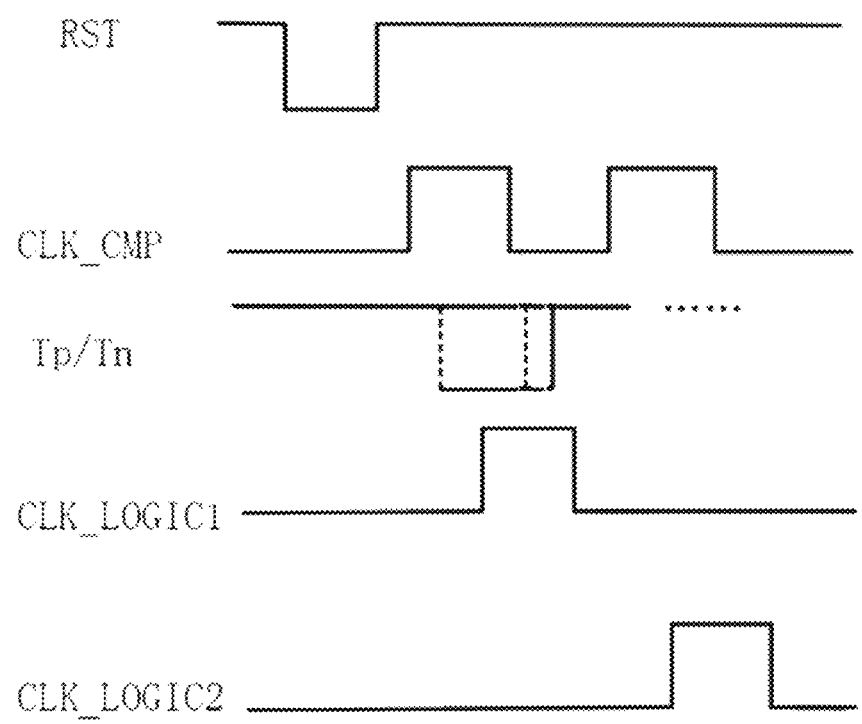
FIG. 4 is an ADC conversion timing diagram of the present disclosure.

A timing diagram of a circuit conversion process is shown in FIG. 4. A control signal is a reset signal RST, a comparator clock CLK_CMP and the logic circuit clocks CLK_LOGIC1 and CLK_LOGIC2 (the CLK_LOGIC1 and the CLK_LOGIC2 correspond to logic circuits controlling a first conversion and a second conversion). Tp and Tn are differential comparison output signals of a comparator without a latch. When a pulse of the reset signal RST arrives (active in a low level), a SAR logic circuit resets. When a pulse of the comparator clock CLK_CMP arrives, the comparator performs an output after a comparison. When pulses of the logic clock CLK_LOGIC1 and CLK_LOGIC2 arrive, the logic circuit performs the first conversion and the second conversion according to comparator output results.

A core circuit for implementing the method in the present disclosure is the logic circuit of the differential pulse positive feedback latch structure in the dotted line box, and a conversion mechanism of the three-state SAR ADC is formed between them and the comparator without the latch. According to this circuit mechanism, other types of three-state SAR ADCs may be formed. For example, through the DAC capacitor array with a separated structure and its corresponding logic circuit, a comparator input common mode is implemented to remain constant during the conversion process of the three-state SAR ADC to meet certain design requirements.

Combined FIG. 3 with FIG. 4, a principle of the circuit and a conversion implementation of the three-state SAR ADC are explained. First, the CLK_CMP is a control signal with a pre-selected pulse width, which not only plays a role in triggering the comparison but also plays a role in timing. Its characteristic pulse width is 8 intrinsic delays of the standard inverter (this is a reference value). The CLK_LOGIC1 and the CLK_LOIC2 are delay signals of the CLK_CMP in this conversion, and delays are about 4 intrinsic delays of the standard inverter. The RST acts as a reset and occurs during an initial sampling phase of the conversion. Here, only a first conversion process is described to illustrate the circuit of the present disclosure.

First, a sampling is completed and the RST is reset, and both DPx and DNx are reset to 0. When a rising edge of the first pulse of the CLK_CMP arrives, the comparator starts to enter a comparison stage of the first conversion. When the comparison is completed, it outputs a dotted line falling edge of the comparison result Tp or Tn. According to a size of the input signal, a position of the dotted line falling edge will be different. For a Tp/Tn pulse shown in FIG. 4, a maximum input signal corresponds to a first dotted line falling edge, and when the signal is small, such as between ±1/4 LSB, it corresponds to a second dotted line falling edge. In case that the falling edge of the first pulse of the CLK_CMP arrives, the comparator is forced to reset, corresponding to a solid line rising edge of the Tp/Tn pulse in FIG. 4. It should be added that when Vp is greater than Vn, Tn outputs a pulse, and when Vp is less than Vn, Tp outputs a pulse. In case that the pulse of the CLK_LOGIC1 arrives, a logic circuit of a first bit conversion begins to enter a logic judgment stage. Since the Tp/Tn pulses received are different, the conversions are also different, and three possible cases may occur in total. In a first case, Vp is greater than Vn, and Vp−Vn is greater than 1/4 LSB. Tn has a pulse, and a width of the pulse is enough to flip the latch in a lower half of the dotted line box (an inverter ring composed of the third and the fifth inverters or the fourth and the six inverters). A state of DNI is flipped from 0 to 1. Tp has no pulse, and a state of DPI remains 1. In a second case, Vp is less than Vn, and Vp−Vn is less than −1/4 LSB. Tp has a pulse, and a width of the pulse is enough to flip the latch in an upper half of the dotted line box. A state of DP1 is flipped from 0 to 1. Tn has no pulse, and a state of DNI remains 1. In a third case, a difference value between Vp and Vn is within ±1/4 LSB, pulse widths of both Tn and Tp are too narrow to flip the latch, and states of DP1 and DN1 remain 0.

A working principle of this circuit is that: a timing pulse clock is generated by the pulse-type clock generator to drive a comparator whose latch device has been removed, and an output of the comparator is connected to a positive feedback latch circuit. In case of different comparator inputs, moments when it outputs comparison results are different. When the input is larger, the moment of outputting the comparison result is earlier; and when the input is smaller, the moment of outputting the comparison result is later. Due to an existence of a timer, all outputs that are not yet determined in case that comparator inputs are less than a certain value, including a metastable state, will be forced to be latched to 1 or 0 within a period of time after timing ends. A state of the logic circuit is not only related to a voltage of the output result of the comparator, but also related to the moment of the output result of the comparator.

The present disclosure provides a new simple logic circuit, which is implemented by a low-cost conventional adder with a low speed requirement. The comparison result arriving before a certain moment corresponds to a comparator input signal that is less than −1/4 LSB or greater than 1/4 LSB (a certain offset is existed actually, such as 1/3 LSB or 1/6 LSB), and its corresponding conversion state is the above-mentioned state one or the state two (above or below the interval). While the comparison result arriving at the certain moment or after the certain moment corresponds to the comparator input signal that is between −1/4 LSB to +1/4 LSB, and its corresponding conversion state is the described state three (within the interval). A final digital output is Dout=1/2 (DN+DP not) (DN and DP are digital logic circuit outputs of both differential terminals of the ADC) to implement effective digital outputs converted from N bits to N+1 bits (a digital output of conventional SAR is Dout=DN or DP not, and DN and DP are mutually negated, that is, a N bit conversion can only provide N bits effective digital outputs, but the present disclosure expands its digital outputs by one bit width).

The present disclosure has technical characteristics as follows.

The three-state successive approximation method improves the quantization efficiency than the two-state successive approximation method. A three-state result is generated in one time of comparison, and more quantitative information is obtained.

The comparison process of the three-state successive approximation method is completed within a given time and generates three-state information, which avoids a need for longer comparison judgment time when the comparator input signals are very close in the two-state successive approximation method, or overcomes a problem of comparator judgment error.

The three-state successive approximation is implemented by the pulse-type clock generator, the comparator without the latch, and a digital logic circuit with a pulse-latch structure at a circuit level, which may form four states according to combinations of different output results of the comparator and different comparison time, converge to 3 states to output control DAC switching in a differential state, and generate a three-state digital output.

The single conversion time implemented by the circuit is only 16 intrinsic delays of the standard inverter, and the logic part implementing the three-state is only 4 intrinsic delays of the standard inverter.

A hardware overhead of the digital logic part implemented by the circuit is extremely small, and a single-terminal digital logic circuit of each bit is composed of only 12 transistors, while a transistor scale of a single-terminal digital logic circuit of the traditional successive approximation ADC is ranged from tens to hundreds.

According to a circuit mechanism of the present disclosure, other types of three-state SAR ADCs may be formed. For example, through the DAC capacitor array with a separated structure and its corresponding logic circuit, a comparator input common mode is implemented to remain constant during the conversion process of the three-state SAR ADC, etc., or a more simplified (replace the AND gate with a transmission tube structure) or more complex (increase inverter series) digital logic circuit is used to implement a same function.

Through the description of the above mechanism, the circuit of the present disclosure can be used as embodiments of implementing the three-state SARADC of the present disclosure.

All embodiments of the present disclosure may be implemented independently or in combination with other embodiments, which are all regarded as the scope of protection required by the present disclosure.

What is claimed is:

1. A successive approximation method of three-state quantization, configured to a successive approximation of an arbitrary analog input signal between 0 to 1 and a N bit, and comprising following steps:
   1) for a first successive approximation of the arbitrary analog input signal between 0 and 1, comparing it with a quantization line 1/2:
      in case that the signal is greater than an interval of $1/2+1/2^{N+1}$, recording the first successive approximation to state one;
      in case that the signal is smaller than an interval of $1/2-1/2^{N+1}$, recording the first successive approximation to state two;
      in case that the signal is located in an interval of $1/2\pm 1/2^{N+1}$, recording the first successive approximation to state three, indicating that an interval where the signal is located has been found at the same time, which is in the interval of $1/2\pm 1/2^{N+1}$, and ending an approximation process;
      in case that the successive approximation to the state one or the state two is generated, then turning to step 2);
   2) performing a second successive approximation according to a state of the first successive approximation;
      in case that a result of the first successive approximation is the state one, continuing to compare the signal with an interval of $3/4\pm 1/2^{N+1}$, with a comparison result producing one of three approximate states;
      in case that the result of the first successive approximation is the state two, continuing to compare the signal with an interval of $1/4\pm 1/2^{N+1}$, with a comparison result producing one of the three approximate states; and
      in case that the successive approximation is generated to the state three, indicating that a signal interval has been found, which is within an interval of a quantization reference line, and ending the approximation process;
      in case that the successive approximation is generated to the state one or the state two, then turning to step 3);
   3) by analogy up to a Nth successive approximation, in case that a certain successive approximation is the state three during the comparison process, ending the approximation, indicating that the interval where the signal is located has been found.

2. A successive approximation analog-to-digital converter (ADC) circuit that implements the method according to claim 1, wherein the circuit is composed of a pulse-type clock generator, a comparator without a latch, a first inverter and a second inverter as drivers, logic circuits of N groups of differential pulse positive feedback latch structure and corresponding N groups of digital-to-analog converter (DAC) capacitors, and a logic circuit of each group of differential pulse positive feedback latch structure is composed of a first AND gate, a first N-metal-oxide-semiconductor (NMOS) transistor, a first P-metal-oxide-semiconductor (PMOS) transistor, a third inverter, a fourth inverter and a seventh inverter, as well as a second AND gate, a second NMOS transistor, a second PMOS transistor, a fifth inverter, a sixth inverter and an eighth inverter with same structures;

a connection relationship is as follows: differential input terminals of a first comparator are connected to differential signals Vp and Vn respectively, a clock terminal of the first comparator is connected to a comparator clock CLK_CMP of a timing pulse generated by the pulse-type clock generator, two differential comparison output terminals Tn and Tp of the first comparator are connected to an input terminal of the first inverter and an input terminal of the second inverter respectively, an output terminal of the first inverter is connected to an input of the first AND gate, an output terminal of the second inverter is connected to an input of the second AND gate, and another inputs of the first AND gate and the second AND gate are connected to a logic circuit clock CLK_LOGICx, where x is any number from 1 to N, an output terminal of the first AND gate is connected to a gate terminal of the first NMOS transistor, an output terminal of the second AND gate is connected to a gate terminal of the second NMOS transistor, a source terminal of the first NMOS transistor and a source terminal of the second NMOS transistor are grounded, a source terminal of the first PMOS transistor and a source terminal of the second PMOS transistor are connected to a power supply, and reset signals RST are connected to a gate terminal of the first PMOS transistor and a gate terminal of the second PMOS transistor respectively, and a drain terminal of the first PMOS transistor and a drain terminal of the second PMOS transistor are connected to a drain terminal of the first NMOS transistor and a drain terminal of the second NMOS transistor respectively and output to input terminals of the third inverter and the fifth inverter respectively, and output terminals of the third inverter and the fifth inverter are connected to input terminals of the fourth and seventh inverters and input terminals of the sixth and eighth inverters respectively, while an output terminal of the fourth inverter is connected to an input terminal of the third inverter, and an output terminal of the sixth inverter is connected to an input terminal of the fifth inverter; and power supplies and ground terminals of the seventh inverter and the eighth inverter are connected to a positive reference voltage Vrefp and a negative reference voltage Vrefn respectively, and output terminals of the seventh inverter and the eighth inverter output a digital code DPx and a digital code DNx to connect lower plates of a first capacitor and a second capacitor respectively, upper plates of the first capacitor and the second capacitor are connected to Vp and Vn respectively, and the first capacitor and the second capacitor constitute a differential unit in a DAC capacitor array.

* * * * *